United States Patent [19]
Tihanyi

[11] Patent Number: 5,914,619
[45] Date of Patent: Jun. 22, 1999

[54] TRIGGER CIRCUIT FOR A POWER FET HAVING A SOURCE-SIDE LOAD

[75] Inventor: Jenoe Tihanyi, Kirchheim, Germany

[73] Assignee: Siemens Aktiengesellschaft, Munich, Germany

[21] Appl. No.: 08/907,213

[22] Filed: Aug. 6, 1997

[30] Foreign Application Priority Data

Aug. 6, 1996 [DE] Germany ............... 196 31 751

[51] Int. Cl.⁶ ................................. H03K 19/094
[52] U.S. Cl. ...................... 327/109; 327/432; 327/434
[58] Field of Search ................... 327/108–112, 309, 327/318, 320–322, 432, 434

[56] References Cited

U.S. PATENT DOCUMENTS 4,859,875   8/1989   Tihanyi et al. .................. 327/424
5,352,932  10/1994   Tihanyi .......................... 327/109

FOREIGN PATENT DOCUMENTS

0236967A1   9/1987   European Pat. Off. .

*Primary Examiner*—Kenneth B. Wells
*Attorney, Agent, or Firm*—Herbert L. Lerner; Laurence A. Greenberg

[57] ABSTRACT

A circuit configuration for driving or triggering a power FET connected in series with a load on the source side and coupled to a supply voltage terminal on the drain side, includes a charge pump supplying an output signal fed to a gate terminal of the power FET, a depletion-mode FET having a load path through which a gate-source capacitance of the power FET can be discharged, a device for driving or triggering the charge pump and the depletion-mode FET, and a further device for pulling the source of the depletion-mode FET in the direction of the supply voltage, as a function of the drive or trigger signal.

7 Claims, 2 Drawing Sheets

TRIGGER CIRCUIT FOR A POWER FET HAVING A SOURCE-SIDE LOAD

BACKGROUND OF THE INVENTION

FIELD OF THE INVENTION

The invention relates to a circuit configuration for triggering or driving a power FET connected in series with a load on the source side and coupled to a supply voltage terminal on the drain side, having a charge pump supplying an output signal fed to a gate terminal of the power FET, a depletion-mode FET with a load path through which a gate-source capacitance of the power FET can be discharged, and a device for triggering the charge pump and the depletion-mode FET.

Such a circuit configuration is disclosed in U.S. Pat. No. 5,352,932. That patent discloses, for example in FIG. 1, a circuit which on one hand has a charge pump, and on the other hand has a device for rapidly turning off the power FET. If, in accordance with FIG. 1, a switch 12 is turned on, then an FET 5 and thus a bipolar transistor 8 are switched on. As a result, the power FET 1 is also switched on and the latter remains switched on since the gate voltage is increased by the necessary value due to a square-wave signal at a terminal 11. The switch 12 is opened for the purpose of turn-off, as a result of which the depletion-mode FET 16 is switched on and the gate-source capacitance of the power FET is consequently discharged.

That known circuit has the following disadvantage: in the event of an overcurrent, that is to say when there is a low-impedance load, the gate voltage of the power FET 1 is held at approximately the Zener voltage of a Zener diode 15 when a voltage drop between a supply voltage terminal 3 and a load terminal 4, that is to say the drain-source path of the power FET 1, is large. Since the gate-source voltage across a depletion-mode FET 16 assumes a small value in that case, the depletion-mode FET 16 is switched on and consequently draws the current of the charge pump for as long as it remains switched on. That produces a dip in the limited switch-on peak current. Such a dip is disadvantageous particularly in the case of a lamp switch, where very high switch-on peak currents occur.

SUMMARY OF THE INVENTION

It is accordingly an object of the invention to provide a trigger circuit for a power FET having a source-side load, which overcomes the hereinafore-mentioned disadvantages of the heretofore-known devices of this general type.

With the foregoing and other objects in view there is provided, in accordance with the invention, a circuit configuration for triggering a power FET having a source side connected in series with a load and a drain side coupled to a supply voltage terminal, comprising a charge pump feeding an output signal to a gate terminal of the power FET; a depletion-mode FET having a load path for discharging a gate-source capacitance of the power FET; a device for triggering the charge pump and the depletion-mode FET; and a further device for pulling a source of the depletion-mode FET in the direction of the supply voltage, as a function of a trigger signal.

The advantage of the configuration is that the source potential of the depletion-mode FET is pulled in the direction of the supply voltage potential by using a relatively simple device. As a result, the depletion-mode FET remains deactivated during this turn-on phase. It is only by deliberately turning off the configuration that the depletion-mode FET is switched on again and can thus discharge the gate-source capacitance of the power FET.

In accordance with another feature of the invention, there is provided a transistor having a load path connected between the source terminal of the depletion-mode FET and the supply voltage terminal.

In accordance with a further feature of the invention, there is provided a controllable current source supplying an output signal, and a device across which there is a voltage drop, for feeding the output signal of the controllable current source to the source terminal of the power FET.

In accordance with an added feature of the invention, the current source and the device across which there is a voltage drop are interconnected at a node in a series circuit, and the transistor has a control terminal connected to the node.

In accordance with an additional feature of the invention, there is provided a resistor connected between the source terminal of the depletion-mode FET and the source terminal of the power FET.

In accordance with yet another feature of the invention, the depletion-mode FET has a substrate terminal connected to the source terminal of the power FET.

In accordance with yet a further feature of the invention, in order to be able to use the configuration according to the invention even at relatively high voltages, the gate of the depletion-mode FET is driven or triggered through a reverse-biased diode and a resistor is connected between the gate of the depletion-mode FET and the source of the power FET.

In accordance with a concomitant feature of the invention, the reverse-biased diode is an FET having short-circuited gate and source terminals and a substrate terminal coupled to the supply voltage terminal.

The diodes can be constructed as MOS diodes, and the resistors can likewise be realized by using MOS technology.

Other features which are considered as characteristic for the invention are set forth in the appended claims.

Although the invention is illustrated and described herein as embodied in a trigger circuit for a power FET having a source-side load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
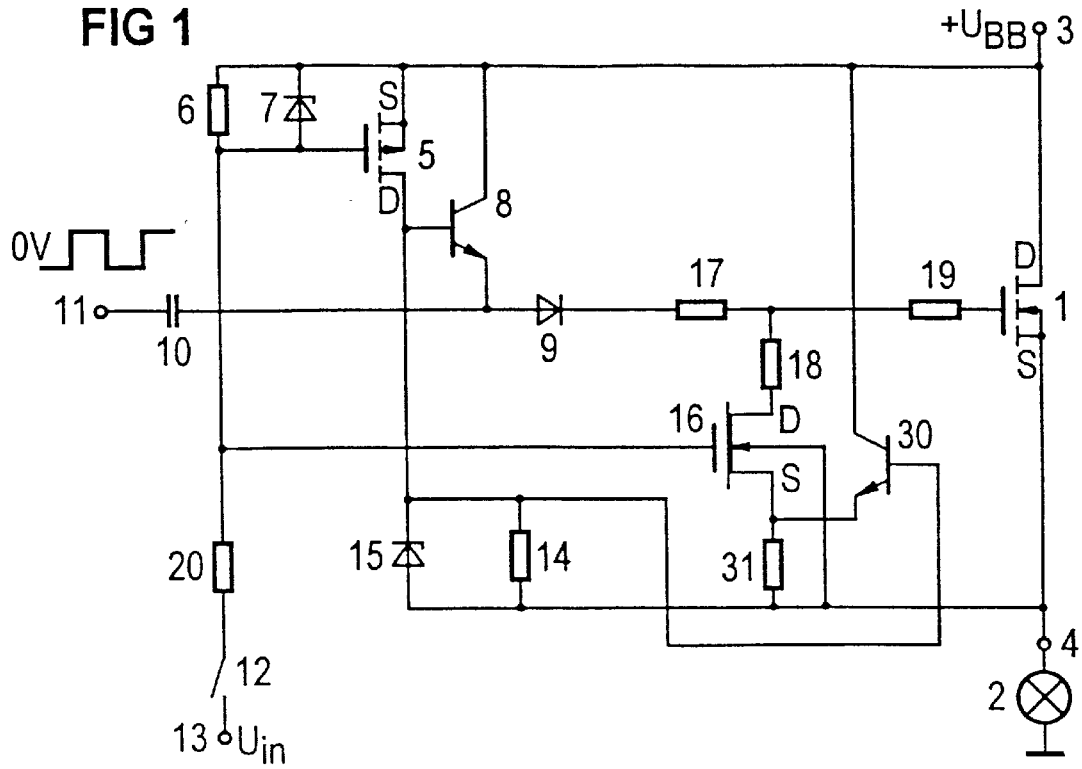
FIG. 1 is a schematic diagram of a first exemplary embodiment of a circuit configuration according to the invention.

Referring now in detail to the figures of the drawings, in which completely identical elements are designated by identical reference symbols, and first, particularly, to FIG. 1 thereof, there is seen a circuit configuration which contains a first power FET 1 having a drain terminal D that is connected through a terminal 3 to a supply voltage +U$_{BB}$. The power FET 1 has a source terminal connected through a terminal 4 to a load 2. The load is connected at one end to ground (load ground). A series circuit formed by a controllable current source in the form of a second FET 5 and a resistor 14, is connected between the drain terminal and the source terminal of the power FET 1. The FET 5 is of the channel type opposite that of the power FET 1. The FET 5 has a source terminal connected to the drain terminal of the power FET 1, and a drain terminal connected to the resistor 14. A resistor 6 is connected between a gate terminal of the second FET 5 and the source terminal thereof. A Zener diode 7 is connected parallel to the resistor 6.

A gate terminal of the power FET 1 is connected through resistors 17, 19 and a first diode 9 to one terminal of a capacitor 10. Another terminal of the capacitor 10 is connected to a first input terminal 11. An emitter terminal of an npn bipolar transistor 8 is connected to a junction point between the capacitor 10 and the first diode 9. A base terminal of the bipolar transistor 8 is connected to the drain terminal of the second FET 5, and a collector terminal thereof is connected to the source terminal of the second FET 5. A third FET 16 is constructed as a depletion-mode FET. A drain-source path of the third FET 16 is connected through a resistor 18 and the resistor 19 to the gate terminal of the power FET 1 and through a resistor 31 to the source terminal of the power FET 1. A gate terminal of the third FET 16 is connected on one hand through a resistor 20 and a controllable switch 12 to a second input terminal 13, and on the other hand to the gate terminal of the second FET 5. A further npn transistor 30 has a collector connected to the supply voltage terminal 3 and an emitter connected to the source terminal of the depletion-mode FET 16. A base terminal of the transistor 30 is connected to the drain terminal of the second FET 5.

If the controllable switch 12 is closed, then the potential at the source terminal of the depletion-mode FET 16 is pulled in the direction of the supply voltage U$_{BB}$, since the collector-emitter path of the transistor 30 is switched on through a Zener diode 15 and the resistor 14. The decoupling of the source of the depletion-mode FET 16 and the source of the power FET 1 is effected through the resistor 31, while a substrate terminal of the depletion-mode FET 16 continues to be connected to the source terminal of the power FET 1. As a result, the charge pump can operate completely effectively and the gate voltage of the power FET 1 can thus be increased freely, irrespective of an output voltage at the terminal 4.

Figure 2:
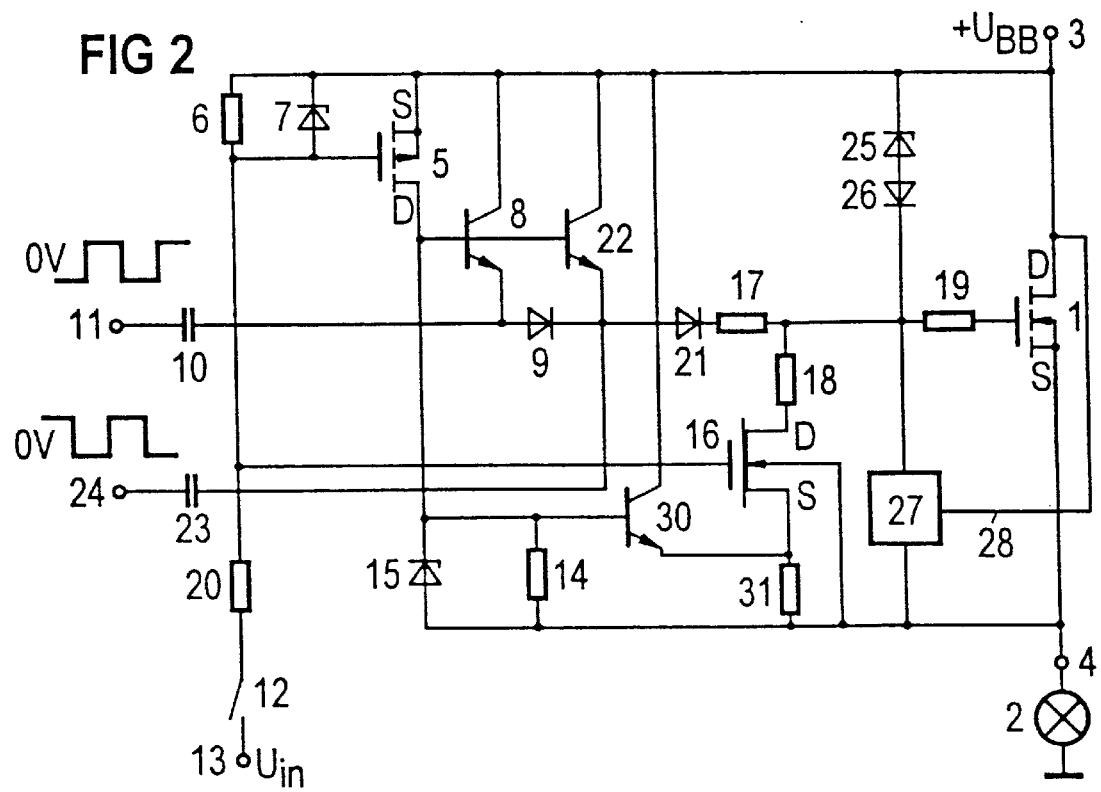
FIG. 2 is a schematic and block diagram of a second exemplary embodiment of a circuit configuration according to the invention.

The circuit configuration according to FIG. 2 differs from that according to FIG. 1 by a series of developments, which can each be employed by themselves or in any desired combination.

According to a first development, a reverse-connected series circuit formed by a Zener diode 25 and a diode 26 can be connected between the drain terminal of the power FET 1 and the junction point between the resistors 17 and 19. In this case, the cathode of the Zener diode is connected to the drain terminal of the power FET 1. This suppresses voltage spikes which can occur when an inductive load is disconnected.

According to a second development, a device 27 for voltage limiting can be provided between the junction point between the resistors 17 and 19 and the source terminal of the power FET 1. This device is controlled over a control line 28 by the drain voltage of the power FET 1, in such a way that when the drain-source voltage increases, for example due to a short circuit, the gate-source voltage of the power FET is reduced. This enables current limiting to be achieved in the power FET.

A further improvement may reside in connecting a third diode 21 between the first diode 9 and the resistor 17. In this case, an anode of the diode 21 is connected to a cathode of the diode 9. A junction point between the two diodes is connected through a further capacitor 23 to a third input terminal 24.

If the terminal 24 has a pulse train applied to it which is phase-shifted through 180° with respect to the pulse train applied to the input 11, then the voltage which is pumped up at the cathode terminal of the diode 9 is added to the voltage of the capacitor 23. This achieves a faster rise in the gate voltage of the power FET 1.

Discharging of the capacitor 23 in a charging intermission is prevented through the use of a base-emitter junction of a bipolar transistor 22, having an emitter which is connected between the cathode of the diode 9 and the anode of the diode 21. Collector and base terminals of the bipolar transistor 22 are respectively connected to the collector and base terminals of the bipolar transistor 8. The bipolar transistor 22 is turned on through the FET 5, at the same time as the bipolar transistor 8. The gate-source capacitance of the power FET 1 is additionally charged through the collector-emitter path of the bipolar transistor 22, the diode 21 and the resistors 17 and 19.

Figure 3:
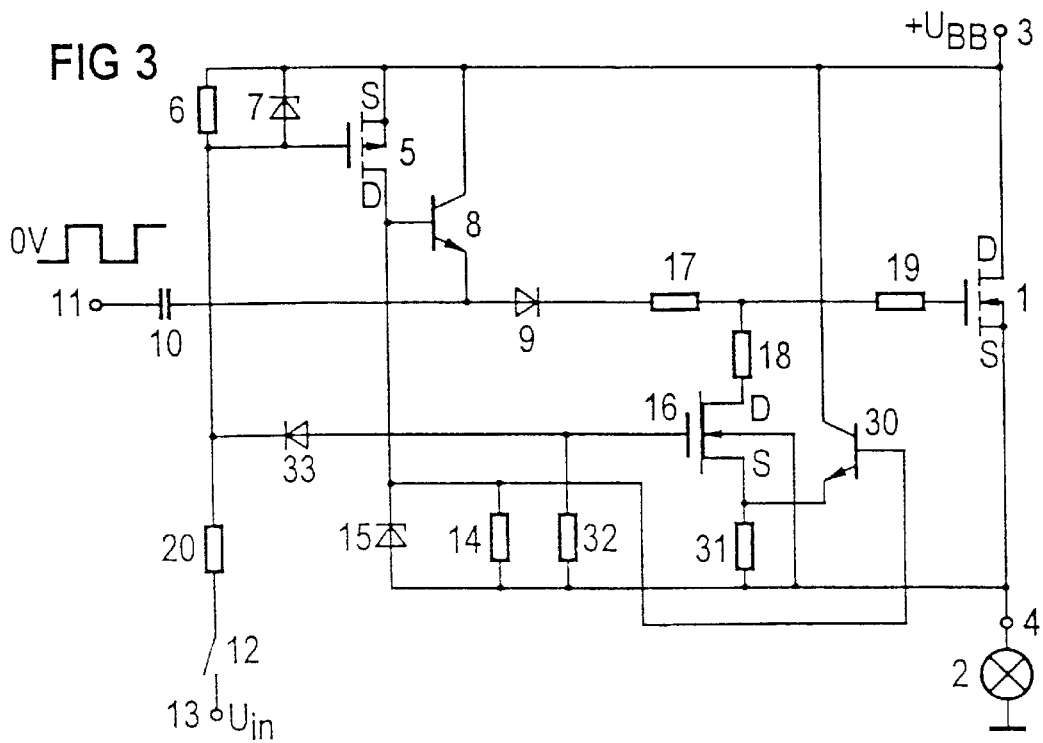
FIG. 3 is a schematic diagram of a third exemplary embodiment of a circuit configuration according to the invention.

FIG. 3 shows a development in relation to FIG. 1, in which a reverse-biased diode 33 is interposed in the gate terminal line of the depletion-mode FET 16. Consequently, an anode of the diode 33 is connected to the gate of the depletion-mode FET 16 and a cathode of the diode 33 is connected to a node of the series circuit formed by the two resistors 6 and 20. Furthermore, a resistor 32 is connected between the gate terminal of the depletion-mode FET 16 and the source terminal of the power FET 1.

This solution is suitable for relatively high voltages since the gate oxide of the depletion-mode FET 16 has an additional voltage-limiting property.

Figure 4:
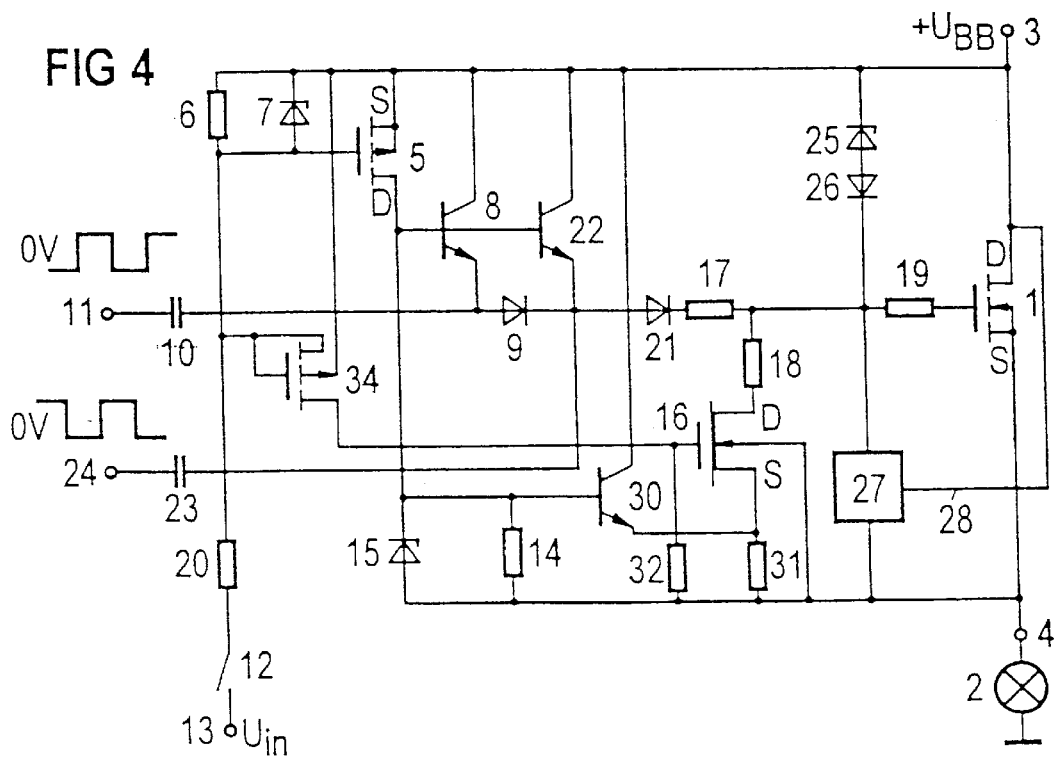
FIG. 4 is a schematic and block diagram of a fourth exemplary embodiment of a circuit configuration according to the invention.

The embodiment according to FIG. 4 differs from the embodiment according to FIG. 2 by providing an FET 34 which is connected as a diode. Gate and source terminals of the FET 34 are connected to one another and to the node of the series circuit formed by the two resistors 6 and 20. A drain terminal of the FET 34 is connected to the gate terminal of the depletion-mode FET 16. In addition, a substrate terminal of the FET 34 is connected to the supply voltage terminal 3.

Consequently, a reverse-biased diode, formed by the FET 34, is also connected into the gate supply line of the depletion-mode FET 16 in this case as well. In this exemplary embodiment as well, the gate terminal of the depletion-mode FET 16 is connected through a resistor 32 to the source terminal of the power FET 1.

I claim:

1. In a circuit configuration for triggering a power FET having a source terminal connected in series with a load and a drain terminal coupled to a supply voltage terminal, the improvement comprising:

a charge pump feeding an output signal to a gate terminal of the power FET;

a depletion-mode FET having a source terminal and a load path discharging a gate-source capacitance of the power FET;

a device for triggering said charge pump and said depletion-mode FET; and a bipolar transistor having a load path connected between said source terminal of said depletion-mode FET and the supply voltage terminal, said bipolar transistor pulling said source terminal of said depletion mode transistor in a direction of the supply voltage as a function of a trigger signal.

2. The circuit configuration according to claim 1, including a controllable current source supplying an output signal, and a device across which there is a voltage drop, for feeding the output signal of said controllable current source to the source terminal of the power FET.

3. The circuit configuration according to claim 2, wherein said current source and said device across which there is a voltage drop are interconnected at a node in a series circuit, and said transistor has a control terminal connected to said node.

4. The circuit configuration according to claim 1, including a resistor connected between said source terminal of said depletion-mode FET and the source terminal of the power FET.

5. The circuit configuration according to claim 1, wherein said depletion-mode FET has a substrate terminal connected to the source terminal of the power FET.

6. The circuit configuration according to claim 1, including a resistor connected between a gate terminal of said depletion-mode FET and the source terminal of the power FET, and a reverse-biased diode triggering the gate of said depletion-mode FET.

7. The circuit configuration according to claim 6, wherein said reverse-biased diode is an FET having short-circuited gate and source terminals and a substrate terminal coupled to said supply voltage terminal.

\* \* \* \* \*